US005591969A

United States Patent [19]

Park et al.

[11] Patent Number: 5,591,969

[45] Date of Patent: Jan. 7, 1997

[54] INDUCTIVE DETECTOR FOR TIME-OF-FLIGHT MASS SPECTROMETERS

[75] Inventors: Melvin Park, Bremen, Germany; John H. Callahan, Alexandria, Va.

[73] Assignee: The United States of America as represented by the Secretary of the Navy, Washington, D.C.

[21] Appl. No.: 420,536

[22] Filed: Apr. 12, 1995

[51] Int. Cl.$^6$ .................... H01J 37/244

[52] U.S. Cl. .................... 250/287; 250/283; 250/286; 250/397

[58] Field of Search .................... 250/287, 286, 250/283, 397

[56] References Cited

U.S. PATENT DOCUMENTS 3,226,543 12/1965 Melzner .................... 250/287

OTHER PUBLICATIONS

Park et al., Rapid Communications in Mass Spectrometry, vol. 8, No. 4, Apr. 1994, pp. 317–322.

Macfarlane et al., "*Californium–252 Plasma Desorption Mass Spectroscopy*", *Science* 191, 920(1976).

Fenn et al., "*Electrospray Ionization–Principles and Practive*", *Mass Spectrom. Revs.* 9, 37(1990).

Karas et al., "*Influence of the Wavelength in High–Irradiance Ultraviolet Laser Desorption Mass Spectrometry of Organic Molecules*", *Anal. Chem.* 57, 2935(1989).

Beavis et al., "*Factors Affecting the Ultraviolet Laser Desorption of Proteins*", *Rapid Commun. Mass Spectrom.* 3, 233(1989).

Karas et al., "*Laser Desorption Ionization of Proteins with Molecular Masses Exceeding 10 000 Dalton*", *Anal. Chem.* 60, 2299(1988).

Beavis et al., "*Velocity Distributions of Intact High Mass Polypeptide Molecule Ions Produced by Matrix Assisted Laser Desorption*", *Chemical Phys. Lett.* 181(5), 476(1991).

Spengler et al., "*Fundamental Aspects of Prostsource Decay in Matrix–Assisted Laser Desorption Mass Spectrometry. 1. Residual Gas Effects*", *J. Phys Chem.* 96, 9678(1992).

Karas et al., "*UV Laser Matrix Desorption/Ionization Mass Spectrometry of Proteins in the 100 000 Dalton Range*", *Int. J. of Mass Spectrom. & Ion Process.* 92, 231(1989).

Wiza, "*Microchannel Plate Detectors*", *Nucl. Inst. Meth.* 162, 587(1979).

Geno et al, "*Secondary Electron Emission Induced by Impact of Low–Velocity Molecules Ions on a Microchannel Plate*", *Int. J. of Mass Spectrom. & Ion Process.* 92, 195(1989).

Comisarow, "*Signal Modeling for Ion Cyclotron Resonance*$^{a)}$", *J. Chem. Phys.* 69(9), 4097–4104(1978).

Hillenkamp et al., "*Matrix–Assisted Laser Desorption/Ionization Mass Spectrometry of Biopolymers*", *Analytic Chem.* 63(24), 1193A–1203A(1991).

*Primary Examiner*—Jack I. Berman
*Attorney, Agent, or Firm*—Thomas E. McDonnell; Chester L. Jordan

[57] ABSTRACT

A mass spectrometer is disclosed having a detector that detects the induction of a charge as an ion pulse passes by the detector and provides a representative output signal thereof. The inductive detector output signal is present regardless of the presence or intensity of preceding ion pulses and also the inductive detector is relatively insensitive to the velocity of the charged particles being detected. Further, the inductive detector does not destroy the vast majority of the ion pulses that it detects so that the non-destroyed ion pulses may be further analyzed by spectrometers attached in tandem.

16 Claims, 5 Drawing Sheets

INDUCTIVE DETECTOR FOR TIME-OF-FLIGHT MASS SPECTROMETERS

BACKGROUND OF THE INVENTION

The present invention relates to a mass spectrometer employed to analyze chemical compounds and mixtures in terms of their distinct mass spectra and, more particularly, to an inductive sensing electrode to detect charged particles constituting the ionized samples of the chemical compound being analyzed.

The accuracy of mass spectrometers is primarily determined by three fundamental steps which are ion production, analysis, and detection, wherein a shortcoming in any of these fundamental steps degrades the quality of the results obtained by a spectrometer. The advent of plasma desorption mass spectrometer (PDMS) and, more recently, electrospray ionization, and matrix assisted laser desorption/ionization (MALDI) have significantly increased the mass spectra range obtainable in mass spectrometry.

One method mass spectrometers can employ is the pulsed time-of-flight method for acquiring mass spectra of the ionized samples. The charged particle detection in time-of-flight mass spectrometry is usually performed by using either a microchannel plate (MCP) detector, a discrete stage electron multiplier dectector, or occasionally, Faraday cups serving as a detector. Each of these detectors manifests certain problems that limit the accuracy of the detection of the charged particle, and thus, represent drawbacks to the associated time-of-flight mass spectrometers.

First Problem

MCP detectors usually consist of two electrodes in which microchannels (25 micron diameter $5\times10^5$ channels/plate) have been formed. The channels are coated with electrically resistive material, usually lead oxide. In operation, ions having a sufficiently high velocity impact on the lead oxide to induce the emission of electrons. These electrons are multiplied via collisions with the walls of the microchannel electrodes in much the same way electrons are multiplied in the well-known photomultiplier tube. It is the presence of these electrons at the anode of the MCP detector which is recorded in mass spectra. The number of electrons emitted due to the impact of an incident ion is dependent upon the impact velocity and which dependence creates a first disadvantage for the MCP detector. For example, if the velocity is low, then the probability for electron emission, and therefore detection, is also low. In time-of-light mass spectrometry, higher mass ions have lower velocities, therefore MCP detectors can disadvantageously discriminate against higher mass ions.

Second Problem

MCP detectors also suffer from a second problem of being saturated by intense pulses of charged particles which may be expected in time-of-flight mass spectrometry. Because an MCP detector requires several milliseconds to recover from such saturation, the sensitivity of the MCP detector to detect subsequently occurring pulses containing charged particles is correspondingly reduced. Thus, if an ionization technique produces many low mass ions (as is found in matrix-assisted laser desorption application MALDI), the signal response and thus detection, for later arriving (higher mass) ions can be suppressed, disadvantageously leading to further higher mass ions discrimination.

Third Problem

The MCP detectors encounter a third problem because their operation requires that the ions must strike its associated detector in order to produce a detection signal. Because the ions are destroyed during this collision type operation, the ions cannot be analyzed further. The destruction of the ions prevents correlated measurements by subsequent mass spectrometers which may otherwise provide beneficial analysis of ionized samples of materials.

Fourth Problem

Discrete stage electron multiplier detectors rely on the same general detection principle as MCP detectors having attendant disadvantages. The discrete stage electron multiplier detectors consist of an initial copper/beryllium (Cu—Be) conversion dynode (where ions cause electron emission), followed by discrete amplification stages (individual dynodes separated by space and electrical potential differences). In general, the discrete stage electron multiplier detectors are sensitive, but have the same disadvantages as the MCP detectors described above for problems 1, 2 and 3, with an additional problem that their temporal response is generally not as accurate as that of the MCP detectors.

Fifth Problem

Faraday cup detectors suffer the same problem as the MCP detectors destroying the detected charged particles but are not plagued by the mass discrimination problems or saturation problems associated with both the MCP detectors and the discrete stage electron multiplier detectors. Faraday cup detectors consist primarily of a surface or cup onto which, or into which, ions are directed. As ions strike the surface or cup, current flows to neutralize the impinging charge and this current flow is measured directly and is indicative of the detected charged particles. However, when ions strike the surface or cup, delayed electron emission can occur, disadvantageously broadening the apparent ion detection signal and distorting the relative sensitivity for the various ion samples being analyzed.

OBJECTS OF THE INVENTION

Accordingly, an object of the present invention is to provide a detector for the detection of charged particles generated by the pulse method involved in time-of-flight mass spectrometry that does not suffer from the prior art techniques of having its operation dependent upon the presence or intensity of preceding ion pulses that have already been detected.

Another object of the present invention is to provide a detector for time-of-flight mass spectrometry whose detection efficiency is relatively insensitive to the velocity of the charged particles being detected.

A still further object of the present invention is to provide a detector that allows for the non-destruction of the majority of the charged particles being detected so as to allow for multiple stage spectrometry experiments to be performed on a single charged particle pulse, thereby, providing correlation between subsequently timed measurements.

Further still, it is an object of the present invention to provide for a detector which detects only charged species, so that the neutral species, normally observed in linear time-of-light matrix assisted laser desorption/ionization (MALDI) techniques, do not appear in the recorded spectra of the mass spectrometer.

SUMMARY OF THE INVENTION

The present invention is directed to an inductive detector for the detection of charged particles generated by pulse methods involved in time-of-flight mass spectrometry. The principle of the detection of the present invention is based on the creation of the induction of a charge on a conducting element as the ions that are being analyzed pass through or by the inductive detector.

The mass spectrometer of the present invention measures the spectra of pulses of charged particles moving along a predetermined flight path and comprises a sensing electrode and, preferably, a converter circuit. The sensing electrode is formed of an electrically conductive material and is located relative to the flight path so that the charged particles being sensed induce a charge signal on the surface of the electrode when passing by the electrode. The converter circuit has means for receiving the charge signal and developing an output signal representative thereof.

BRIEF DESCRIPTION OF THE DRAWINGS

These and other objects, features and advantages of the present invention, as well as the invention itself, will become better understood by reference to the following detailed description when considered in connection with the accompanying drawings, wherein like reference numbers designate identical or corresponding parts throughout the several views, and wherein:

FIG. 3 is composed of FIGS. 3A and 3B, wherein

FIG. 4 is composed of FIGS. 4A and 4B, wherein

FIG. 5 is composed of FIGS. 5A and 5B, wherein

DETAILED DESCRIPTION OF THE PREFERRED EMBODIMENTS

Figure 1:
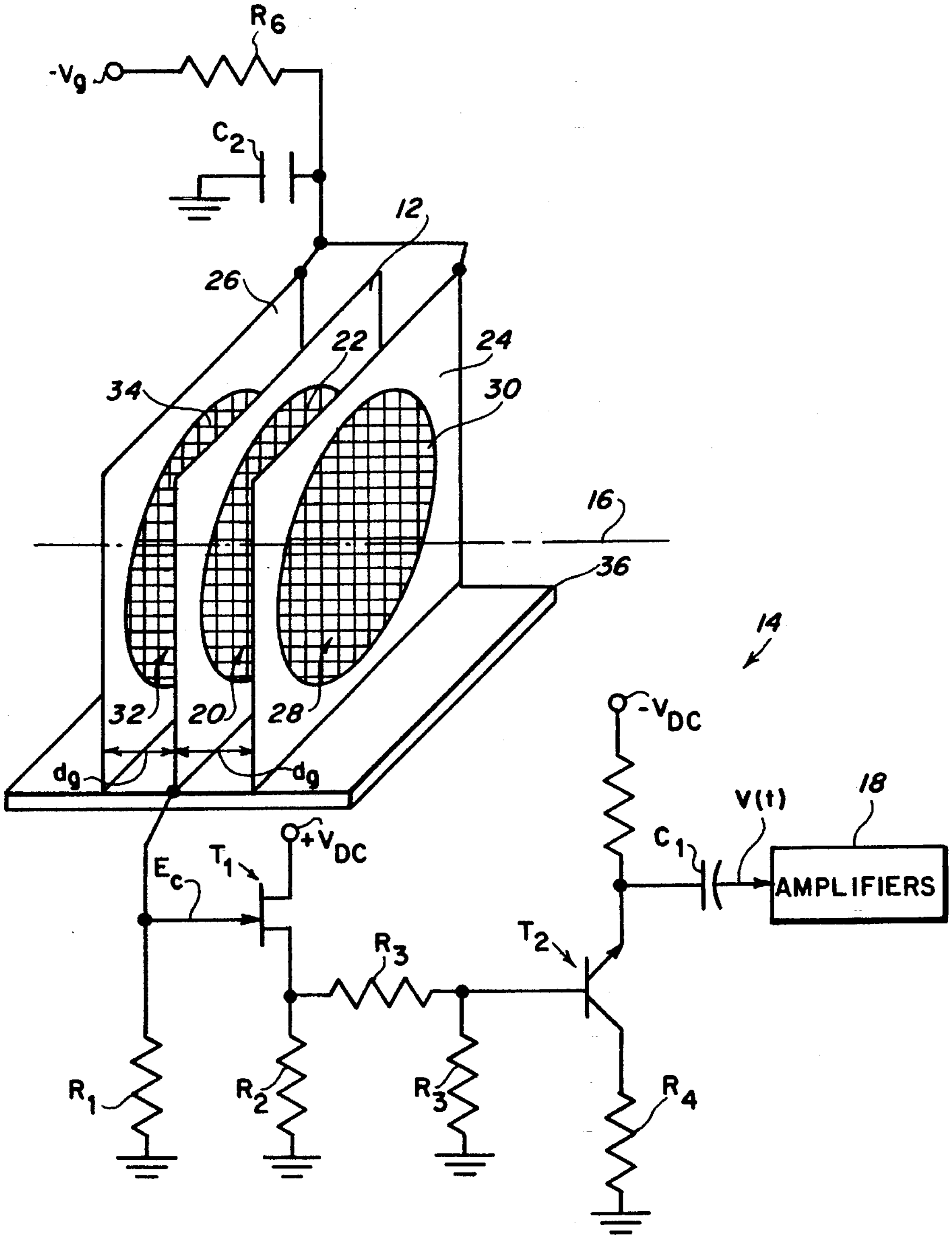
FIG. 1 is a schematic of one embodiment of the inductive detector of the present invention particularly suited for time-of-flight mass spectrometry.

Referring now to the drawings, FIG. 1 illustrates a detector 10 for a known mass spectrometer that utilizes pulsed time-of-flight methods for analyzing chemical compounds and mixtures in terms of their distinctive mass spectra. The time-of-flight spectrometer and detector 10 permit rapid analysis of chemical compounds and mixtures by examining the mass spectrum that can be used to identify a chemical compound or element. The mass spectrometer has an inductive detector 12 which is of prime importance to the present invention and provides for improved detection of charged particles making up the ionized samples being analyzed and involved in pulse methods of the time-of-light mass spectrometry.

In general, the inductive detector 12 detects the induction of a charge as an ion pulse passes by or through and generates a charge signal $E_c$. The inductive detector 12 serves as a sensing electrode and cooperates with a converter circuit 14 that receives the charge signal $E_c$ and develops an output signal V(t). Although converter circuit 14 as shown is preferred, other converter circuits may be used so long as a desired operation, to be hereinafter described, of such a circuit is provided for the inductive detector 12. The inductive detector 12 is located relative to the flight path 16 of the charged particles being measured so that the charged particles induce a charge signal on the surface of the inductive detector 12 when passing by or through the inductive detector 12, in a manner to be described. The converter circuit 14 has means, such as an electrical conductive wire connected to the surface of the inductive detector 12, for receiving the charge signal $E_c$ and comprises a plurality of elements, arranged as shown in FIG. 1, and listed in Table 1 along with their typical values.

TABLE 1

| ELEMENT | VALUE/COMPONENT |
|---|---|
| $R_1$ | 1 mega-ohm |
| $R_2$ | 10 kilo-ohms |
| $R_3$ | 100 ohms |
| $R_4$ | 10 kilo-ohms |
| $R_5$ | 2.2 kilo-ohms |
| $R_6$ | 50 ohms |
| $C_1$ | 1 microfarad |
| $T_1$ | Field Effect Transistor |
| $T_2$ | NPN Transistor |

The converter circuit 14 of FIG. 1 is preferably located inside a vacuum chamber and is arranged, in a well known manner, into a voltage follower, sometimes referred to as a cathode or emitter follower, and need not provide any amplification. It is found that the operation of the converter circuit 14, verified by measuring the output of the converter circuit 14 across its 50 ohm load ($R_6$), produces an overall attenuation of the charge signal $E_c$ by a factor of about 4. To provide for desired amplification, the output signal V(t) of converter circuit 14 may be routed to one or more amplifiers 18. In one application, the output signal V(t) was fed into a 300 Mhz bandwidth amplifier available from Stanford Research Systems, Sunnyvale, Calif. as their Model #SR440, which amplifies its received signals by a factor of about 17. The output of this 300 Mhz amplifier was directly connected to or AC coupled to, the input of a second amplifier which may a 150 Mhz amplifier available from Hewlett-Packard of Loveland, Calif. as their Model #462. The interconnection between the 300 Mhz and 150 Mhz may be implemented by way of a capacitor. The AC coupling between the 300 Mhz and 150 Mhz desirably filters out low frequency noise and may be used to assist in desired signal shaping. The combinational effect of the two amplifiers (300 Mhz and 150 Mhz) amplifies the signal V(t) by a factor of 1,000. The arrangement shown consisting of the conversion circuit 14 and two such amplifiers provide for a net amplification by a factor of about 250.

The inductive detector 12 need only comprise a first member generally illustrated in FIG. 1, having a central opening 20, having a typical value of 2.54 cm, with its center approximately located in correspondence with the flight path of the charged particles and covered with a screen 22. Second 24 and third 26 members are preferably positioned in parallel with and on opposite sides of the inductive detector 12, with the second member 24 being positioned forwardly of inductive detector 12 and the third member 26 being positioned rearward of the inductive detector 12. The second member 24 has a central opening 28 covered with a screen 30, and the third member 26 has a central opening 32 covered with a screen 34. The central openings 28 and 32, and the screens 30 and 34 are respectively arranged in correspondence with the opening 20 and the screen 22 both of the inductive detector 12. The inductive detector 12, in and of itself, may serve as the sensing electrode of the present invention, but it is preferred that the inductive detector 12 cooperate with the second and third members 24 and 26 to serve as the sensing electrode of the present invention.

The inductive detector 12, and the second and third members 24 and 26 are preferably selected to have a shape of that of a plate and/or one of a curved configuration. Each of the members (24 and 26), as well as the inductive detector 12 may be square and have an edge length of about 3.55 centimeters (cm). Further, each of the members 24 and 26, as well as the inductive detector 12, are of a conductive material, such as, stainless steel. The members 24 and 26 are electrically connected to a negative (–) polarity of about 10 volts and are preferably connected thereto by a filter network comprising resistor $R_6$, having a typical value of 1 megaohm, and a capacitor $C_2$, having a typical value of 0.01 microfarads.

Each of the screens 22, 30 and 34 is preferably comprised of nickel (Ni) and is selected of a particular mesh-size so as to allow about 90% of the charged particles to pass through the related openings 20, 28 and 32, without contacting the respective screen 22, 30 or 34. The inductive detector 12 and the second and third members 24 and 26 are hereinafter respectively referred to as detector grid 12, first shielding grid 24 and second shielding grid 26. It should be noted that the term "grid" refers to the overall structure of devices 12, 24 and 26 and not only to the meshes 22, 30 and 34 of these devices 12, 24 and 26 respectively.

Figure 2:
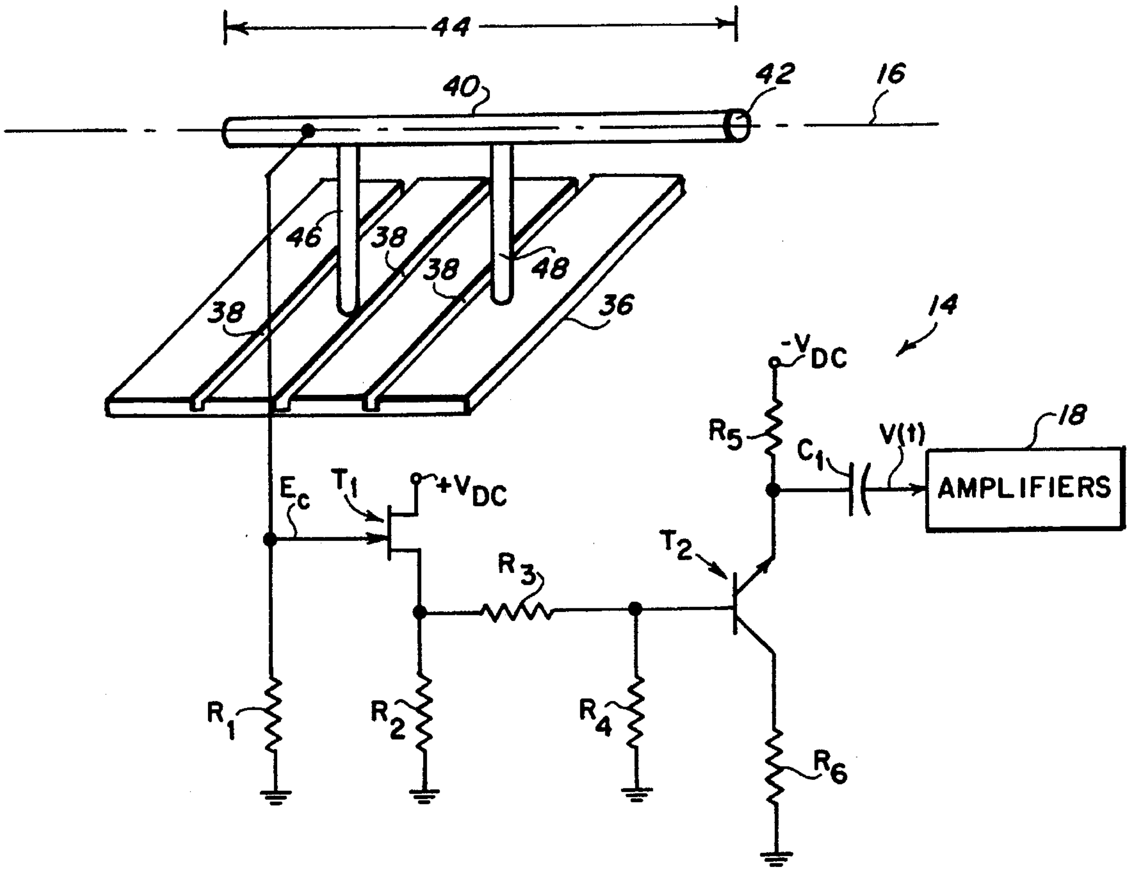
FIG. 2 illustrates a second embodiment of an inductive detector of the present invention.

The first and second shielding grids 24 and 26 are each spaced apart from the detector grid 12 by a predetermined distance $d_g$, having a preferred value of about 0.57 cm, and are held in place, relative to their desired position, by means of a tray 36 having apertures 38 (not shown in FIG. 1 but shown in FIG. 2). The tray 36 of FIGS. 1 and 2 or individual spacers (not shown) may be used to hold the shielding grids 24 and 26 in place relative to the detector grid 12. Further, the tray 36 or the individual spacers serve as a means to insulate the shielding grids 24 and 26 and detector grid 12 from each other.

In general, and with reference to the operation of the circuit arrangement of FIG. 1, the detector grid 12 has a charge induced on its surface as charged particles pass by it or through it, by which is meant that the charged particles pass by the overall structure of detector grid 12 or through its screen 22. The detector grid 12 is connected to the gate of the field effect transistor, T1, serving as a high input impedance for the converter circuit 14. The detector grid 12 is preferably designed so as to make the capacitance, to be further described, between itself and its surroundings as small as possible. Also, the input capacitance of the converter circuit 14 should be designed to be as small as practical so as to avoid the draining away of the charge signal $E_c$ from the detector grid 12. The detector grid 12 should also be connected to ground through a high input resistor, such as $R_1$ having a resistance of 1 mega-ohms, so as to drain away charge that is captured on the detector grid 12 as opposed to those charges induced on the detector grid 12. Charged particles pass into the general region of the detector grid 12 by entrance into the opening 28 in the shielding grid 24. While between the shielding grids 24 and 26, the charged particles can induce a charge on the detecting grid 12 and also on the nearest shielding grid 24 and 26. The electrical potential on the shielding grids 24 and 26 is constant because these shielding grids 24 and 26 are AC coupled to ground, via capacitor $C_2$. However, the electrical potential on the detector grid 12 varies with the number of charged particles it encounters and the distance of the charged particle from the detector grid 12. As a pulse of charged particles comes into the general region of the detector grid 12, the electrical potential on the detector grid 12 first increases as the charged particles approach the detecting grid 12, and then decreases as the charged particles move away from the detector grid 12. Ion capture also deposits charge on the detector grid 12, but this charge is advantageously passed to ground through the resistor $R_1$.

The screens 22, 30 and 34 have a mesh size selected, as known in the art, to establish a transmission efficiency of 90% and so 10% of the charged particle beam will strike any given detector grid 12 or shielding grids 24 and 26 as the beam passes through the associated screen. For the three grid arrangement shown in FIG. 1, since each of the selected meshes has a 90% transmission efficiency, approximately 72% of the ions will pass through the accumulated three screens 22, 30 and 34 without being captured. Although it is desired that the detector grid 12, and shielding grids 24 and 26 have a square shape, each of the grids may be curved instead of flat and also the detector grid 12 serving as a sensor electrode may also comprise a member having a cylindrical shape and which may be further described with reference to FIG. 2.

As seen in FIG. 2, a sensing electrode 40 comprises a cylindrical member having a tubular shape with a predetermined diameter 42 defining a bore therein as well as a rim thereof. The sensing electrode 40 also has a predetermined length 44. The outer surface or rim, carrying the charge signal $E_c$, of the sensing electrode 40 is connected to ground, via the high impedance resistance $R_1$, and to the conversion circuit 14, via the field effect transistor $T_1$, all previously described with reference to FIG. 1. The approximate center of the diameter 42 is positioned along the flight path 16 of the charged particles and is held in that position by appropriate means, such as columns 46 and 48 formed of a ceramic material and which also serve as insulating members. It is desired that the electrode 40 be positioned along the flight path 16 so that the charged particles induce a charge on the sensing electrode 40 which is equal, or nearly equal, to the charge of the incident particle. It is further desired that the length 44 of electrode 40 be much greater than the diameter 42 of the electrode 40. More particularly, it is desired that the length 44 be at least 10 times greater than the diameter 42. If the length 44 is the same or smaller than the diameter 42 of the electrode 40, then the maximum charge induced on the electrode 40 by a charged particle will depend on the trajectory of the particle. That is, if the trajectory of the particle is near the axis of the electrode 40, then the maximum charge induced on the electrode will be less than that induced by the same particle if the trajectory is near the rim of the electrode 40. This dependence on the trajectory of the charge will cause the apparent number of sensed ions to change dependent upon the trajectory of the ions. However, by increasing the length 44 of the electrode 40 relative to the diameter 42, the difference in the inductive signal intensity caused by different ion trajectories is minimized. The main advantage of the embodiment shown in FIG. 2 is that practically none of the ions entering the electrode 40, via its bore defined by diameter 42, is destroyed by collision with the detecting element, in this case, the cylindrical electrode 40. The main disadvantage of the embodiment of FIG. 2 is that the shapes of the signals that the charged particles produces, by the operation of electrode 40, will be difficult to de-convolute and correct by appropriate software routines, which correction is beneficial in determining the results of the mass spectrometer in which the electrode 40 is used.

It should now be appreciated that the practice of the present invention provides an inductive detector grid having the square-like shape illustrated in FIG. 1 or the cylindrical shape of FIG. 2 so that the inductive detector grid, or the shielding grids 24 and 26, may be readily adapted to a variety of different shapes and sizes. This adaptation is useful in cases, for example, where an ion beam has a large cross section and the inductive detector grid may be fabricated accordingly.

Referring back to FIG. 1, the three basic processes which produce the signal $E_c$ of the inductive detector grid 12 comprise the induction of a charge on the detector grid 12, charge capture when the ion strikes the detector grid 12, and electron emission caused by the ion striking the detector grid 12. The operation of the inductive detector grid 12 provides three principle advantages, the first of which is that the inductive detector grid 12 cannot be saturated by high abundance of ions entering the general region of the inductive detector grid 12 so long as the previous ion pulses have left the general region of the inductive detector grid 12 before a new one or more pulses arrive in the general region of the detector grid 12, thereby allowing for succeeding pulses not to be effected by earlier pulses. This is particularly useful in matrix assisted laser desorption techniques, where high abundances of low molecular weight ions enter the general region of the detector grid 12 followed by the slower moving higher molecular weight ions.

A second principle advantage of the detector grid 12 is that its sensitivity to a higher molecular weight species is not inherently dependent on the velocity of these higher molecular weight species as they enter the general region of the detector grid 12. Since the detector grid 12 senses the charge between grids, that is, between shielding grids 24 and 26, relative to detector grid 12, the detector grid 12 registers a signal despite the mass of the ion. The prior art methods correct for this discrimination problem of higher molecular weight species by accelerating the higher molecular weight ions with very high voltages (on the order of up to 20 kilo-volts (kV)) so that the heavy ions will have a high enough velocity to produce a desired detection signal. However, the present invention not suffering this higher molecular weight species problem may utilize a voltage of only about −10 volts to accelerate the movement of ions and still not be limited in any way by any higher molecular weight ions.

A third advantage of the detector grid 12 is that it is essentially a non-destructive detector. In the three-grid detector grid arrangement shown in FIG. 1, the meshes for screens 22, 30 and 34 have a 90% transmission efficiency, so that approximately 72% of the ions pass through the three grid arrangement without being captured. Thus, the three grid arrangement of FIG. 1 may be placed in a mass spectrometer which is arranged in series with another mass spectrometer to provide the capability to detect non-destroyed ions for additional experiments. This application allows for the arrangement of tandem mass spectrometers experiments so that the ions that are initially separated by flight time by the first mass spectrometer, often called the parent ion of one mass, are selected by an ion optical component in the first mass spectrometer, and the selected ion is activated by absorption of photons, or by collision with electrons, gases or surfaces while still being in the first mass spectrometer. Fragments from the activation process are then analyzed by the mass analysis stage of the tandem connected second mass spectrometer. The inductive detector grid 12 of the present invention provides the capability of detecting the parent ion prior to activation without completely destroying the ions, allowing for more accurate timing of subsequent experiments. Moreover, the ability to monitor the parent ion directly provides the opportunity to make time correlated measurements of a subsequent process, which may eliminate the necessity of mass-selection and thereby improve sensitivity.

Figure 3A:
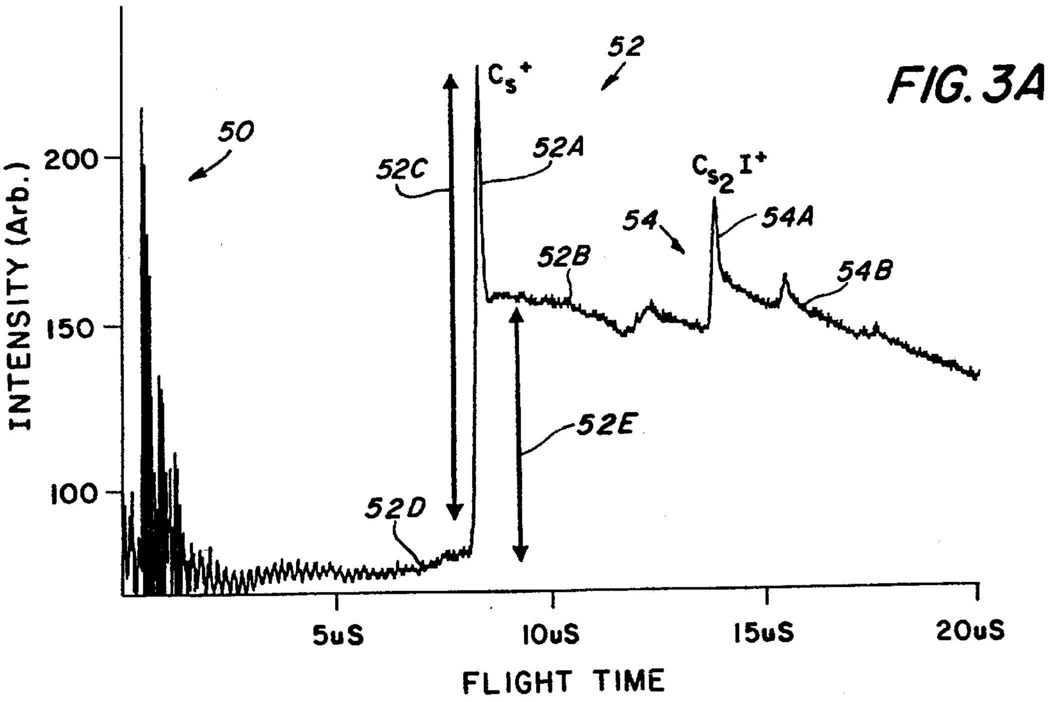
FIG. 3A illustrates the induction and charge capture and electron emission signals.
Figure 3B:
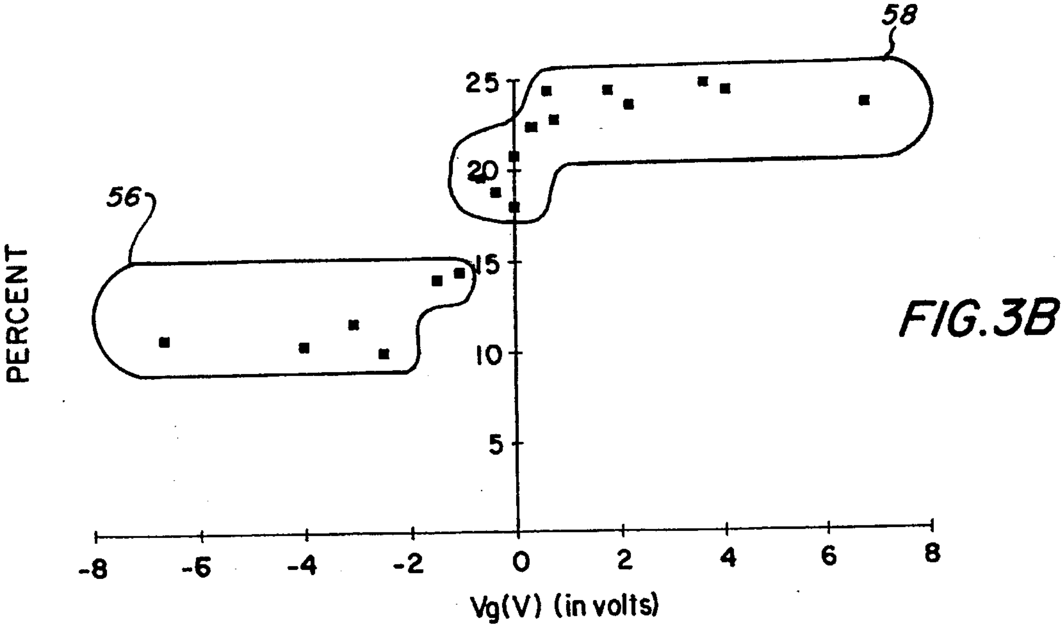
FIG. 3B illustrates the percentages related to the charge capture signals relative to the charge capture and electron emission signals, all involved in operation of the inductive detector of the present invention.

The operation of a mass spectrometer utilizing the inductive detector grid 12 may be further described with reference to FIG. 3 composed of FIGS. 3A and 3B. FIG. 3 shows the laser desorption mass spectrum of cesium iodide (CsI) obtained using the inductive detector grid 12. The results of FIG. 3, to be more fully described hereinafter, show that the signals produced by the inductive detector 12 are characterized by two components, which as will be further described, can be described as peak and plateau components. More particularly, ions passing through or by the detector grid 12 produce a peak signal, resulting from increasing induction of charge in the detector grid 12 as ions approach, followed by decreasing induction in the detector grid 12 as the ions leave the general region of detector grid 12. However, not all ions that enter the general region of the detector grid 12 pass through the screens 22, 30 and 34 (see FIG. 1) (since the screens 22, 30 and 34, in particular, their mesh size, have 90% transmission efficiency). In those cases where the ion strikes the screens 22, 30 and 34, the ion charge is captured by the related detector grid 12 or shielding grids 24 and 26 and electron emission may occur. The resulting charge produced by the striking ions is neutralized, via the resistor $R_1$ (see FIG. 1) connected to ground, more slowly than the inductive charge disappears. Thus, the ion striking the three grid arrangement of FIG. 1 and the resulting electron emission produce a plateau following each peak.

In interpreting the results of FIG. 3, it is useful to consider how many ions are represented by the signals and what are the relative contributions of these ions to charge induction and charge capture/emission. First, when considering the signal produced by charge capture and electron emission, the voltage difference between the plateau and the baseline is proportional to the charge on the sensing electrode. For example, with reference to FIG. 3A, having an x-axis indicative of the flight time (given in microseconds) determined by the mass spectrometer 10 and a y-axis indicative of the intensity of the signal, not having any definite units and thus designated as arbitrary (arb), the substance $Cs^+$ produces a signal 52 having a peak 52A and a plateau 52B and wherein the depicted distance 52C indicates the height (voltage difference) of the induction signal relative to baseline 52D, and the depicted distance 52E indicates the height (voltage difference) of the charge capture and electron emission signal, also relative to the baseline 52D. All of these signals are produced by a laser source (not shown) which generates the noise spikes 50 as depicted in FIG. 3A. The sensing electrode from which the results of FIG. 3A, as well as FIGS. 3B, 4 and 5, are depicted were obtained from the configuration illustrated in FIG. 1, wherein the sensing electrode 12 takes the form of the detector grid 12 spaced apart from shielding grids 24 and 26 by the predetermined distance $d_g$, also shown in FIG. 1.

The potential on the detector grid 12 is inversely proportional to the capacitance between the detector grid 12 and surrounding electrodes, i.e., the shielding grids 24 and 26 in addition to the input capacitance of the field effect transistor (FET) ($T_1$ of FIG. 1) of the converter circuit 14 and stray capacitances of, for example, the signal wire interconnecting the detector grid 12 to the FET ($T_1$). Because the charge deposited by incident ions and left behind by emitted electrons appears on the detector grid 12 (and also possibly shielding grids 24 and 26) much more quickly than it is drained away therefrom, the maximum potential difference between the baseline 52D of FIG. 3A and either of the plateaus 52B or 54B (to be described) of FIG. 3A represents the total amount of charge (charge capture and electron emission) on the detector grid 12.

The peak shaped portion (52A and 54A) of the signals (52 and 54) in FIG. 3A represents the charge induced on the detector grid 12 as ions pass through or by the detector grid 12. The measurement of the number of ions with detector grid 12 needs to take into account the fact that an ion does not induce a unit charge on the detector grid 12 immediately upon entering the general region of the detector grid 12. Rather, an ion in the region of the detector grid 12—i.e., between the two shielding grids 24 and 26—induces a fractional charge on the detector grid 12, the magnitude of which is dependent on the position of the ion in the general region of the detector grid 12. To a first approximation, the fraction of the ion's charge which is induced on the detector grid 12 is proportional to its distance from the nearest shielding grid (24 or 26) divided by the distance ($d_g$) from the shielding grid (24 or 26) to the detector grid 12. Thus, an ion at a shielding grid (24 or 26) will induce all of its charge on that shielding grid (24 or 26), whereas an ion at the detector grid 12 will induce all of its charge on the detector grid 12. An ion halfway between the detector grid 12 and the shielding grid (24 or 26) will induce half of its charge on the shielding grid (24 or 26) and the other half of its charge on the detector grid 12. Note that this approximation is valid when the grids 12, 24 and 26 are close to each other relative to the dimensions of the grid 12, for example, with a preferred distance $d_9$ of about 0.57 cm. As used herein, the fraction of the ion's charge within the general region of the detector grid 12 may be expressed by the quantity induction, g(x), having the relationship given in the below equations (1) and (2):

$$g(x) = -\frac{x}{d_g}\ ;\ 0 \leqq x \leqq d_g \quad (1)$$

$$g(x) = \frac{x}{d_g} - 2;\ d_g \leqq x \leqq 2d_g \quad (2)$$

where, as discussed with reference to FIG. 1, $d_g$ is the distance from either shielding grid 24 or 26 to the detector grid 12, and the first shielding grid 24 is at the origin of the x-axis related to equations (1) and (2). No charge will be induced on the detector grid 12 when the ion is outside the detector grid 12 region, x<0 or $x>2d_g$. The data shown in FIG. 3 was obtained when the predetermined distance $d_g$ was set to 0.57 cm. The charge induced on the detector grid 12 by a charge q at position x is the product of q and g(x). It should be noted that the charge induced on the detector grid 12 will have a polarity which is opposite that of the associated ion.

If one considers a single ion passing through the general region of the detector grid 12, more particularly, the general region encompassed by grids 12, 24 and 26, the voltage signal, V(t), (see the output of the converter circuit 24 of FIG. 1) measured by an oscilloscope at the amplifier output is given by:

$$V(t)=(\text{Amp } q)g(vt)/c \quad (3)$$

where C is the capacitance between the detector grid 12 and one of the shielding grids 24 and 26 related to the charged particle being sensed, plus the input capacitance of the FET ($T_1$ of FIG. 1), and Amp is the total amplification (provided by amplifiers 18 previously discussed with reference to FIG. 1) of the charge signal $E_c$ on the detector grid 12. In equation (3), g(x) has been translated into a function of time by substituting vt, where v is the ion's velocity, for x. Integrating equation (3) with respect to time gives:

$$\int V(t)dt = \frac{\text{Amp } q}{C} \int g(vt)dt \quad (4)$$

and $$A = \frac{\text{Amp } q}{C}\ G \quad (5)$$

$$q = \frac{AC}{\text{Amp } G} \quad (6)$$

where A is the area under the detected ion signal (such as the area under the signal 56 of FIG. 3A) and G, the induction factor, is the integrated induction function. Clearly, if all the ions in a pulse generated by the mass spectrometer 10 have the same velocity, then G will be the same for all the ions. Equation (6) can be applied not only to single ions but also to signals involving a large number of ions.

The integration of g(vt) of equation (4) with respect to time yields:

$$G=d_g/V \quad (7)$$

The value of G is given in units of time, and represents the time required for the ion to pass halfway through the general region of detector grid 12, more particularly, the region encompassed by the charged particles entering the central opening 28 of the shielding grid 24 until it finds its way to the detector grid 12. The value of the quantity G also represents the minimum full width at half maximum parameter (FWHM). According to equation (7), signals produced by the inductive detector grid 12, in conjunction with a time-of-flight (TOF) mass spectrometer, will disadvantageously broaden with the square root of the mass-to-charge ratio of the ions. This broadening of the peaks can be corrected by software routines assuming one knows the proper induction function (G). Using equations (6) and (7), the area under peak signals 52 and 54 of FIG. 3A can be "corrected," by appropriate software routines, to provide a value proportion to the number of ions incident on the detector grid 12. The values of the capacitance related to grids 12, 24 and 26 and the amplifier gain must be considered in the determination of the actual number of incident ions.

The induction signal intensity of FIG. 3A, related to the sample $Cs^+$, is caused by charge capture and electron emission associated with the detector grid 12 and may be described with reference to FIG. 3B. FIG. 3B has an x axis representing the bias supply $V_g$ (see FIG. 1) given in volts and a y axis indicating the percentage between charge capture (depicted as being encompassed by the cluster 56) and charge capture and electron emission (depicted as being encompassed by the cluster 58). The percentages given in clusters 56 and 58 are derived from the peak quantity 52A and plateau quantity 52B of the sample $Cs^+$ generally indicated as 52 and all of which are depicted in FIG. 3A. More particularly, the area under $Cs^+$ induction peak (52A) is divided by G as discussed above—in this case 65.5 ns (generally shown in FIG. 3A)—and compared to the height (52E) of the charge capture/electron emission plateau (52B). The ratio of the signal intensities is plotted in FIG. 3B as a percentage of the induction signal 52 ($Cs^+$) of FIG. 3A. As seen in FIG. 3B, the electron emission can be suppressed by making $V_g$ sufficiently negative. Note that the signal due to charge capture (encompassed by cluster 56) represents about 10% of the signal due to induction (encompassed by cluster 58). This is in good agreement with the fact that a 90% transmission screens (element 22 of FIG. 1) is used for the detector grid 12, i.e., 10% of the ions are expected to strike the screen 22. By dividing the percent charge capture and electron emission (cluster 58) at a positive voltage by the percent charge capture (cluster 56) at a negative voltage, it is seen that on average 1.7 electrons are emitted per incident $Cs^+$ ion.

Figure 4A:
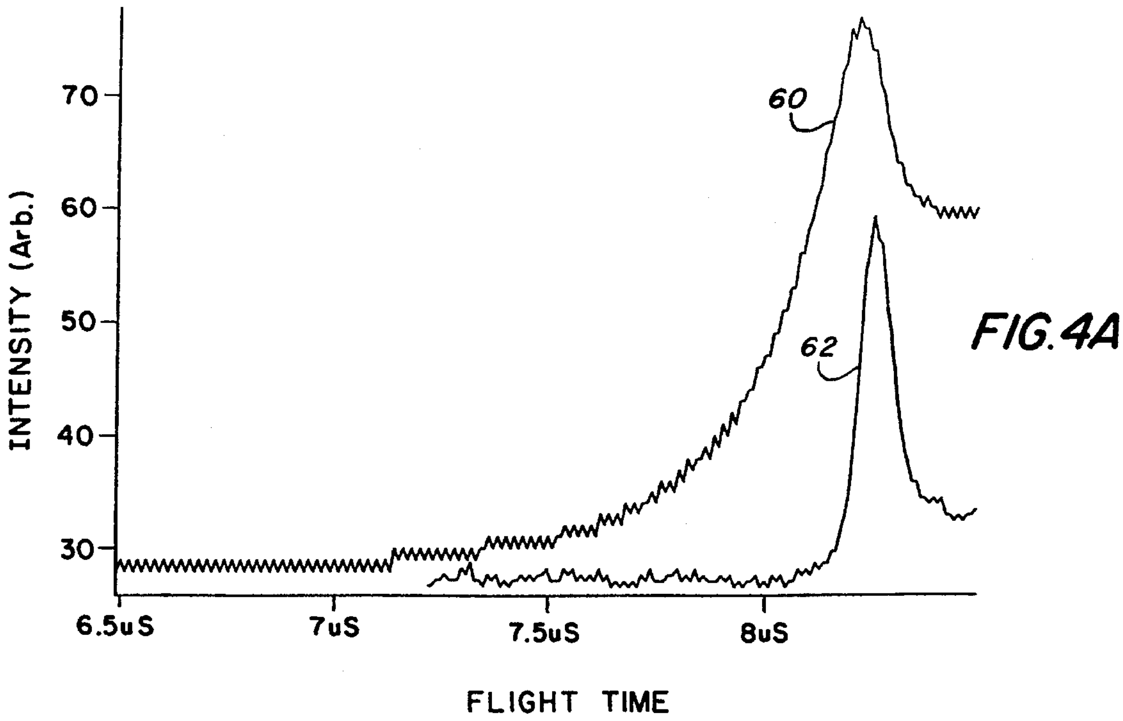
FIG. 4A illustrates the induction signals related to the spacing between the detector and shielding grids of the present invention.
Figure 4B:
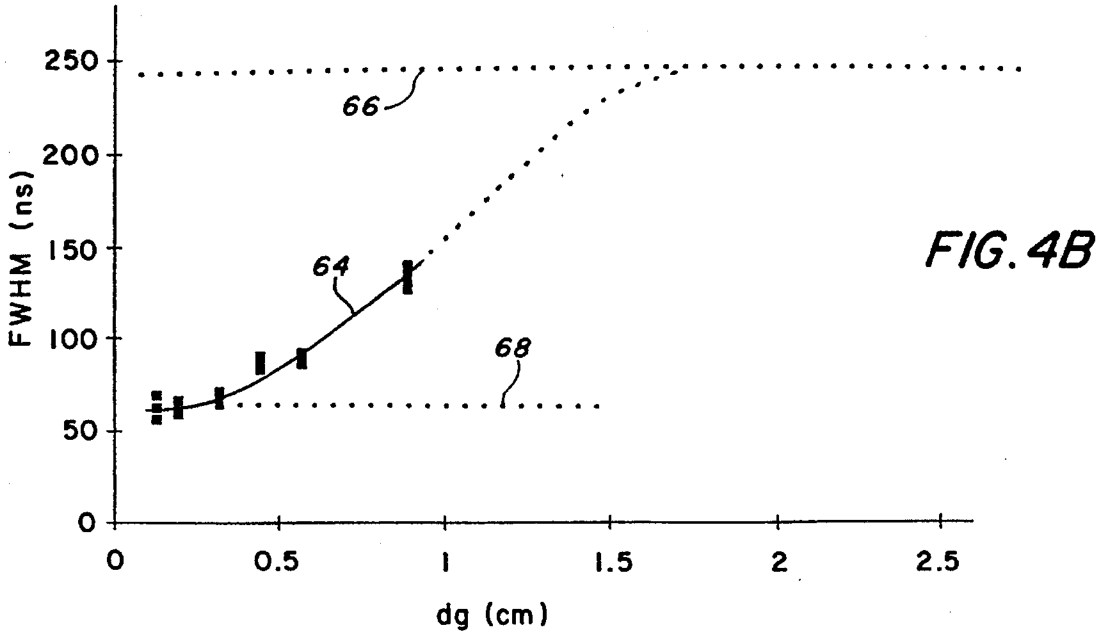
FIG. 4B illustrates plots associated with the related induction signals of the present invention and also those signals measured by a prior art MCP detector.

As noted above, G is given in units of time and represents the minimum FWHM obtainable under a given set of conditions. One of the most readily adjustable factors in determining, G, is $d_g$, the distance between the detector grid 12 and the shielding grids 24 or 26 (see equation (7)). This is demonstrated more clearly in FIG. 4. FIG. 4 comprises FIGS. 4A and 4B, wherein the x and y axes of FIG. 4A are given in the same quantities as described for FIG. 3A. In FIG. 4A, two $Cs^+$ ion signals 60 and 62, obtained with different values of $d_g$, are shown. All other conditions under which the two signals 60 and 62 were obtained were identical. In the case of signal 60, the front shielding grid 24 was removed entirely, while the back shielding grid 26 was held at a distance of 0.89 cm which is considered to be a relatively large distance and for the purposes of this invention considered to be approaching infinity. The induction function given in equations (1) and (2) does not apply in this case because $d_g$ is large relative to the dimensions of the detector grid 12. However, the induction function in this case is still reflected in the peak shape of signal 60. In the second case of signal 62, $d_g$ was small (0.445 cm), so equations (1) and (2) apply to this case. As expected, the peak shape in this case of signal 62 more closely resembles equations (1) and (2) (a triangular function convoluted with the inherent peak shape). Because the capacitance between the detector grid 12 and shielding grids 24 and 26 is a function of $d_g$, the intensity of the two signals 60 and 62 is markedly different (see equation (3)).

Changes in the peak widths of signals 60 and 62 of FIG. 4A are shown more quantitatively in FIG. 4B, having an x axis representing the predetermined distance $d_g$ (given in cm) and a y axis representing the FWHM (given in nanoseconds). FIG. 4B illustrates a plot 64 of the $Cs^+$ ion signal 62, a first relatively straight line 66 representative of $Cs^+$ ion signal 60, and an asymptote 68 representing the measurement of $Cs^+$ ion signals by a conventional microchannel plate (MCP) spectrometer. In FIG. 4B the FWHM of the $Cs^+$ ion signals of plot 64 and asymptote 68 are plotted as a function of $d_g$. The FWHM of the $Cs^+$ ion signal measured by the MCP detector was 64 ns. This may be considered as the FWHM of the $Cs^+$ ion pulse at the entrance of the inductive detector grid 12, more particularly as the $Cs^+$ ion pulse enters the shielding grid 24. Assuming no broadening in the MCP signal, this represents the lower limit of the FWHM of the $Cs^+$ ion signal from the inductive detector grid 12 and is plotted as an asymptote. The upper limit on the FWHM is given by the FWHM obtained from the relatively large (0.89 cm) $d_g$ related to signal 60 of FIG. 4A. As expected from equation (7), the FWHM of the $Cs^+$ signal illustrated by plot 64 decreases with decreasing $d_g$, but is limited when $d_g$ is small compared to the FWHM of the ion signal incident on the detector grid 12. The FWHM of the inductive signal does not approach the FWHM of the MCP asymptote plot 68 until the induction factor G is small compared to the FWHM of the MCP asymptote plot 68. In FIG. 4B, for example, when $d_g$=0.32 cm, the calculated induction factor, G, is 36 ns.

Although decreasing $d_g$ results in better resolution (see FIG. 4A (signal 62)), it also causes an increase in the detector's grid 12 capacitance (the capacitance between two grids 12, 24 and 26 is inversely proportional to the distance between the grids 12, 24 and 26). This decreases the intensity of the signal (see equation (5)). The optimum $d_g$ is chosen as a compromise between higher resolution when $d_g$ is smaller and higher signal intensity when $d_d$ is larger. In the remaining spectra of this study, in the practice of this invention, we set $d_g$ to 0.57 cm which provides both an intermediate resolution and intermediate signal intensity.

Figure 5A:
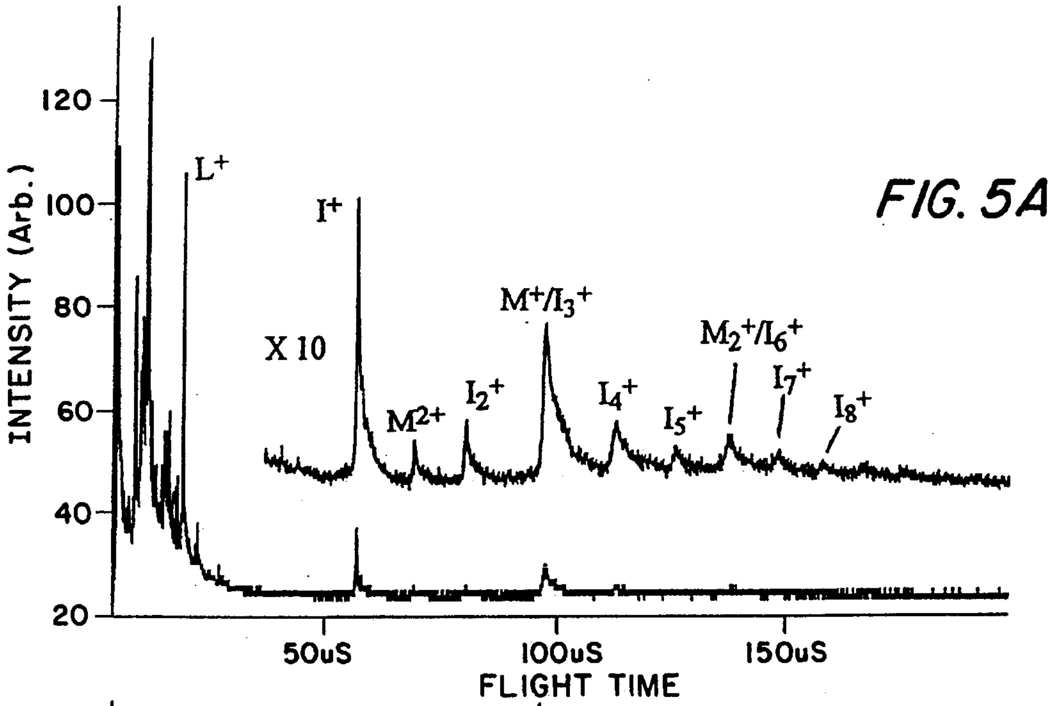
FIG. 5A illustrates the mass spectra associated with ionized samples as respectively measured by a prior art MCP detector.
Figure 5B:
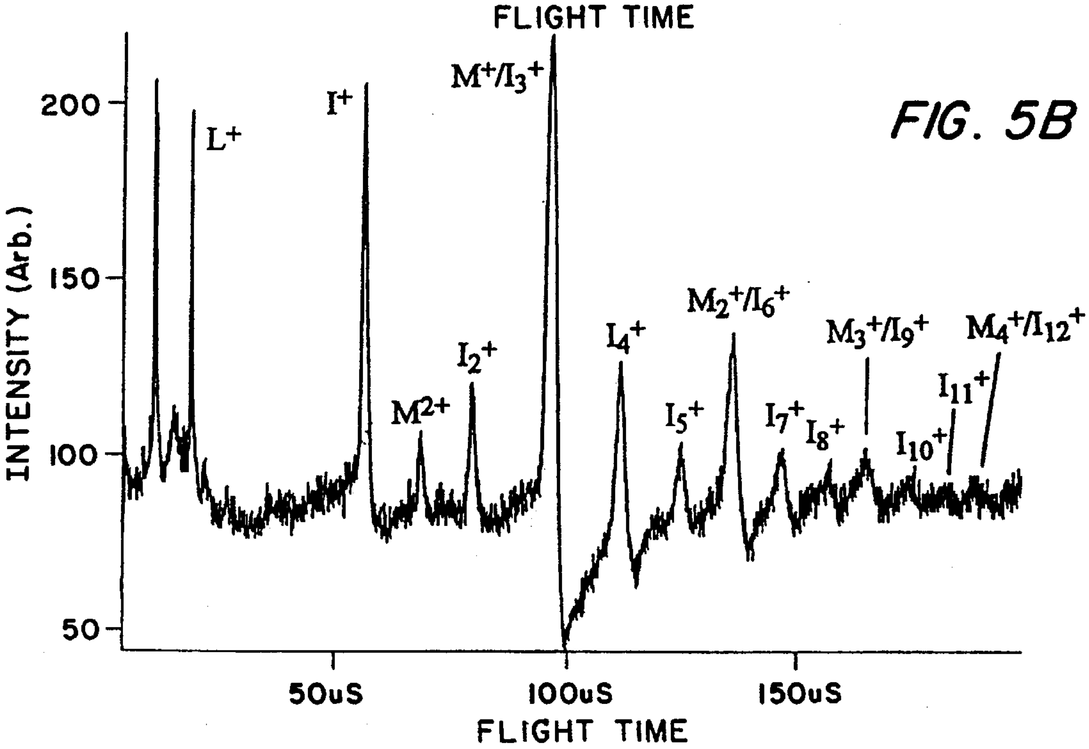
FIG. 5B illustrates the mass spectra associated with ionized samples measured by the inductive detector of the present invention.

As may be seen with reference to equation (7), the value of the induction factor, G, is dependent on the ion velocity as well as $d_g$. To confirm this, we conducted experiments in the practice of this invention and observed the $Cs^+$ peak shape as a function of accelerating potential ($V_g$ of FIG. 1) and found that the width of the signals from the inductive detector grid 12 varied with ion velocity as predicted. The fact that the efficiency of the inductive detector grid 12 does not depend on ion velocity and that the inductive detector grid 12 cannot be saturated makes it potentially useful for matrix assisted laser desorption/ionization (MALDI) and which use is illustrated in FIG. 5 composed of FIGS. 5A and 5B. Each of FIGS. 5A and 5B has x and y axes respectively represented by the quantities already described for FIG. 3A. Further, FIG. 5A illustrates plots related to the measurement performed by a MCP spectrometer according to prior art, whereas FIG. 5B illustrates plots achieved by the measurement of inductive detector grid 12 of FIG. 1. FIG. 5 illustrates the result of the analysis of a mixture of proteins (leu-enkephalin, insulin, and myoglobin) in sinapinic acid. The peaks of the spectra in FIG. 5 are labelled, L, for leu-enkephalin, I, for insulin, and M, for myoglobin molecular and cluster ions.

In order to obtain the spectrum of FIG. 5A, the bias on the MCP detector was selected to −2.4 kV and its related SRS amplifier (known in the art) was used to amplify the signal by a factor of 17. FIG. 5B shows the MALDI spectrum of the same sample obtained using the inductive detector grid 12 of the present invention. It should be noted that to obtain the spectrum of FIG. 5B, the amplifiers 18 of FIG. 1 were AC coupled using a 0.1 μF capacitor ($C_1$ of FIG. 1). This was done mainly to eliminate the plateaus (e.g., see plots 52B and 54B of FIG. 3A) following the peaks (e.g., see plots 52A and 54A of FIG. 3A). However, the effective time constant of the RC filter formed by the coupling capacitor and the input resistance of the HP amplifier (50 ohms) was about 5 microseconds. Because some of the higher mass peaks were wider than this, an undershoot is observed following some of the peaks—e.g., the $M^+/I_3^+$ ion signal (see FIG. 5B).

By visual inspection of the spectra of FIG. 5, it is easy to see that the intensities of signals produced from the MCP detector is dependent on ion mass/velocity, whereas the signal produced by the inductive detector grid 12 is not. The number of ions passing through the inductive detector grid 12 is determined from the peaks in the spectrum of FIG. 4B, in accordance with equation (6).

From the spectrum obtained using the inductive detector grid 12, (FIG. 5B), the number of molecular ions per laser pulse (see laser pulse 50 of FIG. 3A) was, for leu-enkephalin (L) 6,000, for insulin (I) 13,000 and for myoglobin (M) (with $I_3^+$) about 11,000. These values were also used to determine the gain of the MCP for the molecular ions of the proteins. The gain of the MCP for the Leu-enkephalin molecular ion was found to be about $2.5\times10^5$. This gain is a factor of about 10 less than that for $Cs_3I_2^+$ obtained by the practice of the present invention (detector grid 12) under similar conditions. The loss of gain for the MCP detector is presumably a result of overloading the MCP detector with low mass (m/z <600) ions. The MCP detector gains observed for the insulin and myoglobin molecular ions were $7\times10^4$ and $5\times 10^4$ respectively. This decreased gain for the higher mass ions was most likely due to the lower velocity of these ions. The lower gain should not be due to detector saturation from the molecular ions themselves because the number of ions in the molecular ion pulses is relatively low. The MCP gains calculated for $Cs_3I_2^+$ ($2\times10^6$) and for the protein molecular ions are consistent with values known in the art.

In contrast to the MCP detector gain, the inductor detector grid 12 spectrum illustrated in FIG. 5B did not exhibit a decrease in signal intensity with mass as the MCP detector did. Moreover, the inductive detector grid 12 was markedly less affected by high abundances of low mass ions than the MCP detector. This is apparent when the relative intensities of the matrix and analyte ions are compared for the two detectors; the response for low mass ions is clearly more significant (and potentially more of a problem) with the MCP detector.

While the results show that the inductive detector grid 12 is not subject to the same mass discrimination effects as the MCP detector, it should be noted that the relative intensities of the ion signals in both spectra of FIG. 5 are significantly different than the relative concentrations of the proteins in the sample. There are a number of factors in the sample preparation and ionization/desorption processes (e.g., inclusion of the analyte into the matrix, desorption and ionization efficiencies, etc.) which might account for this difference. These factors do not form part of the present invention and, thus, are not to be further described herein.

It should now be appreciated that the practice of the present invention provides for an inductive detector grid 12 serving as a sensing electrode that does not suffer from the drawbacks of having its sensitivity dependent upon on the intensity of preceding ion pulses.

It should be further appreciated that the detection efficiency of the inductive detector grid 12 is relatively insensitive to the velocity of the charged particles being detected. Further, it should be appreciated that the inductive detector grid 12 does not destroy the majority of the charged particles, thereby, allowing the charged particles to be subsequently analyzed by an additional mass spectrometer 10 connected to the output of the mass spectrometer 10 performing the initial analysis. Furthermore, all of the benefits of the detector grid 12 of FIG. 1 are equally applicable to the cylindrical sensing electrode 40 of FIG. 2.

It should, therefore, be readily understood that many modifications and variations of the present invention are possible within the purview of the claimed invention. It is, therefore, to be understood that, within the scope of the appended claims, the invention may be practiced otherwise than as specifically described.

What we claim is:

1. A mass spectrometer for measuring the spectra of pluses of charged particles moving along a predetermined flight path, said mass spectrometer comprising:

a sensing electrode formed of an electrical conductive material and located relative to said flight path so that said charged particles induces a charge signal on the surface of said electrode when passing by said sensing electrode:

a converter circuit having means for receiving said charge signal and developing an output signal representative thereof;

wherein said sensing electrode comprises a first member having a central opening with its center approximately located in said flight path and covered by a screen.

2. The mass spectrometer according to claim 1, wherein said screen comprises nickel (Ni) and is selected of a mesh so as to allow about 90% of said charged particles to pass through said opening without contacting said screen.

3. The mass spectrometer according to claim 1 further comprising second and third members both arranged in parallel with but on opposite sides of said first member and both spaced apart from said first member by a predetermined distance $d_g$, said second and third members each having a central opening covered by a screen that is in correspondence with said screen of said central opening of said first member.

4. The mass spectrometer according to claim 3, wherein each of said screen of said second and third members is selected of a mesh so as to allow about 90% of charged particles respectively approaching said second and third members to pass through said respective opening without contacting said respective screen.

5. The mass spectrometer according to claim 3, wherein each of said opening of said first, second and third members has a diameter of about 2.54 cm.

6. The mass spectrometer according to claim 3, wherein said predetermined distance $d_g$ is about 0.57 cm.

7. The mass spectrometer according to claim 6, wherein first, second and third members are fixed in place by a ceramic member.

8. The mass spectrometer according to claim 3, wherein said second and third members are electrically connected to a negative (–) polarity of about 10 volts.

9. The mass spectrometer according to claim 8, wherein said second and third members are connected to said negative (–) polarity by a filter network.

10. The mass spectrometer according to claim 3, wherein first, second and third members are selected to have a shape of one of a plate and curved configurations.

11. The mass spectrometer according to claim 10, wherein said plate is square and has an edge length of about 3.55 cm.

12. The mass spectrometer according to claim 11, wherein said plate comprises stainless steel.

13. A mass spectrometer for measuring the spectra of pulses of charged particles moving along a predetermined flight path, said mass spectrometer comprising:

a sensing electrode formed of an electrical conductive material and located relative to said flight path so that said charged particles induces a charge signal on the surface of said electrode when passing by said sensing electrode;

a converter circuit having means for receiving said charge signal and developing an output signal representative thereof:

wherein said charge is received by said converter by way of a field effect transistor.

14. A mass spectrometer for measuring the spectra of pulses of charged particles moving along a predetermined flight path, said mass spectrometer comprising:

a sensing electrode formed of an electrical conductive material and located relative to said flight path so that said charged particles induces a charge signal on the surface of said electrode when passing by said sensing electrode;

a converter circuit having means for receiving said charge signal and developing an output signal representative thereof:

wherein said converter circuit is a voltage follower.

15. A mass spectrometer comprising:

an electrode disposed to receive a stream of charged particles; said electrode having openings disposed to permit passage of said stream through said openings effective to cause said particles and said electrodes to produce an electric potential by inductive coupling;

wherein said spectrometer further comprises a voltage follower circuit, for detecting said electric potential.

16. A mass spectrometer for measuring the pulses of charged particles in flight, said spectrometer comprising:

a sensing electrode with an opening, said sensing electrode disposed about said charged particle flight path, effective to allow said charged particles to flow through said opening, said particles inducing a charge signal upon said sensing electrode;

a converter circuit, said converter circuit coupled to said sensing electrode and adapted to receive said charge signal.

* * * * *